US008582351B2

(12) United States Patent
Arsovski et al.

(10) Patent No.: US 8,582,351 B2
(45) Date of Patent: Nov. 12, 2013

(54) METHODS AND SYSTEMS FOR ADJUSTING WORDLINE UP-LEVEL VOLTAGE TO IMPROVE PRODUCTION YIELD RELATIVE TO SRAM-CELL STABILITY

(75) Inventors: Igor Arsovski, Williston, VT (US); George M. Braceras, Essex Junction, VT (US); Kevin W. Gorman, Fairfax, VT (US); Robert M. Houle, Williston, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 452 days.

(21) Appl. No.: 12/892,191

(22) Filed: Sep. 28, 2010

(65) Prior Publication Data
US 2012/0075919 A1 Mar. 29, 2012

(51) Int. Cl.
G11C 11/00 (2006.01)

(52) U.S. Cl.
USPC ............. 365/154; 365/230.06; 365/225.7; 365/201

(58) Field of Classification Search
USPC ................ 365/154, 230.06, 225.7, 201
See application file for complete search history.

(56) References Cited

U.S. PATENT DOCUMENTS

| 2,715,361 | A | 8/1955 | Lasseter |
| 7,079,426 | B2 | 7/2006 | Zhang et al. |
| 7,085,175 | B2 | 8/2006 | Remington et al. |
| 7,177,176 | B2 | 2/2007 | Zheng et al. |
| 7,352,609 | B2 | 4/2008 | Fifield et al. |
| 7,403,426 | B2 | 7/2008 | Hamzaoglu et al. |
| 7,495,950 | B2 | 2/2009 | Fifield et al. |
| 7,570,525 | B2 | 8/2009 | Nii et al. |
| 7,602,654 | B2 | 10/2009 | Yabuuchi et al. |
| 2008/0049534 | A1 | 2/2008 | Fifield et al. |
| 2010/0188886 | A1 | 7/2010 | Behrends et al. |
| 2011/0069574 | A1* | 3/2011 | Hirabayashi ............. 365/226 |
| 2012/0033522 | A1* | 2/2012 | Chuang et al. ......... 365/230.06 |

OTHER PUBLICATIONS

Office Action issued Nov. 23, 2011, with regard to related U.S. Appl. No. 12/892,160, filed Sep. 28, 2010, entitled "SRAM Having Wordline Up-Level Voltage Adjustable to Assist Bitcell Stability and Design Structure for Same," Igor Arsovski.
Response to Office Action dated Feb. 22, 2012, with regard to related U.S. Appl. No. 12/892,160, filed Sep. 28, 2010, entitled "SRAM Having Wordline Up-Level Voltage Adjustable to Assist Bitcell Stability and Design Structure for Same," Igor Arsovski.
Terminal Disclaimer dated Feb. 22, 2012, with regard to related U.S. Appl. No. 12/892,160, filed Sep. 28, 2010, entitled "SRAM Having Wordline Up-Level Voltage Adjustable to Assist Bitcell Stability and Design Structure for Same," Igor Arsovski.

(Continued)

Primary Examiner — Toan Le
(74) Attorney, Agent, or Firm — Downs Rachlin Martin PLLC

(57) ABSTRACT

Methods of setting wordline up-level voltage in as-fabricated SRAM. In one example, the method includes determining the relative speed, or strength, of 1) the combination of the pass-gate and pull-down devices and 2) the pull-up devices in the bitcells of the SRAM. These relative strengths are then used to adjust the wordline up-level voltage, if needed, to decrease the likelihood of the SRAM experiencing a stability failure. Corresponding systems are provided for determining the relative strengths of the devices of interest, for determining the amount of up-level voltage adjustment needed, and for selecting and setting the up-level voltage.

19 Claims, 7 Drawing Sheets

(56) References Cited

OTHER PUBLICATIONS

Hyunwoo Nho, et al. "A 32nm High-κ Metal Gate SRAM with Adaptive Dynamic Stability Enhancement for Low-Voltage Operation," ISSCC 2010/Session 19/ High-Performance Embedded Memory/19.3; 2010 IEEE International Solid-State Circuits Conference, Feb. 2010; pp. 346-347.

Yuki Fujimura, et al. "A Configurable SRAM with Constant-Negative-Level Write Buffer for Low-Voltage Operation with 0.149μm2 Cell in 32 nm High-κ Metal Gate CMOS," ISSCC 2010/Session 19/ High-Performance Embedded Memory/19.4; 2010 IEEE International Solid-State Circuits Conference, Feb. 2010; pp. 348-349.

S. Ohbayashi, et al. "A 65 nm SoC Embedded 6T-SRAM Design for Manufacturing with Read and Write Cell Stabilizing Circuits," 2006 Symposium on VLSI Circuits Digest of Technical Papers; Jun. 2006, IEEE.

K. Nii, "A 45-nm Single-port and Dual-port SRAM family with Robust Read/Write Stabilizing Circuitry under DVFS Environment," 2008 Symposium on VLSI Circuits Digest of Technical Papers; Mar. 2008; IEEE; pp. 212, 213.

Related U.S. Appl. No. 12/892,160, filed Sep. 28, 2010, entitled "SRAM Having Wordline Up-Level Voltage Adjustable to Assist Bitcell Stability and Design Structure for Same," Igor Arsovski.

\* cited by examiner

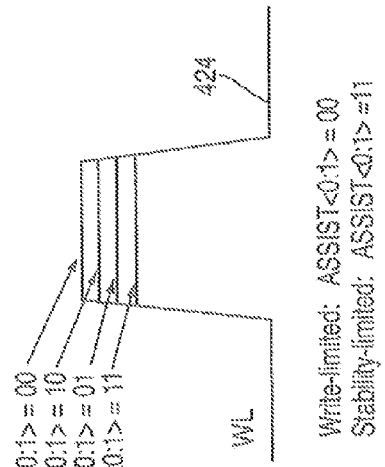
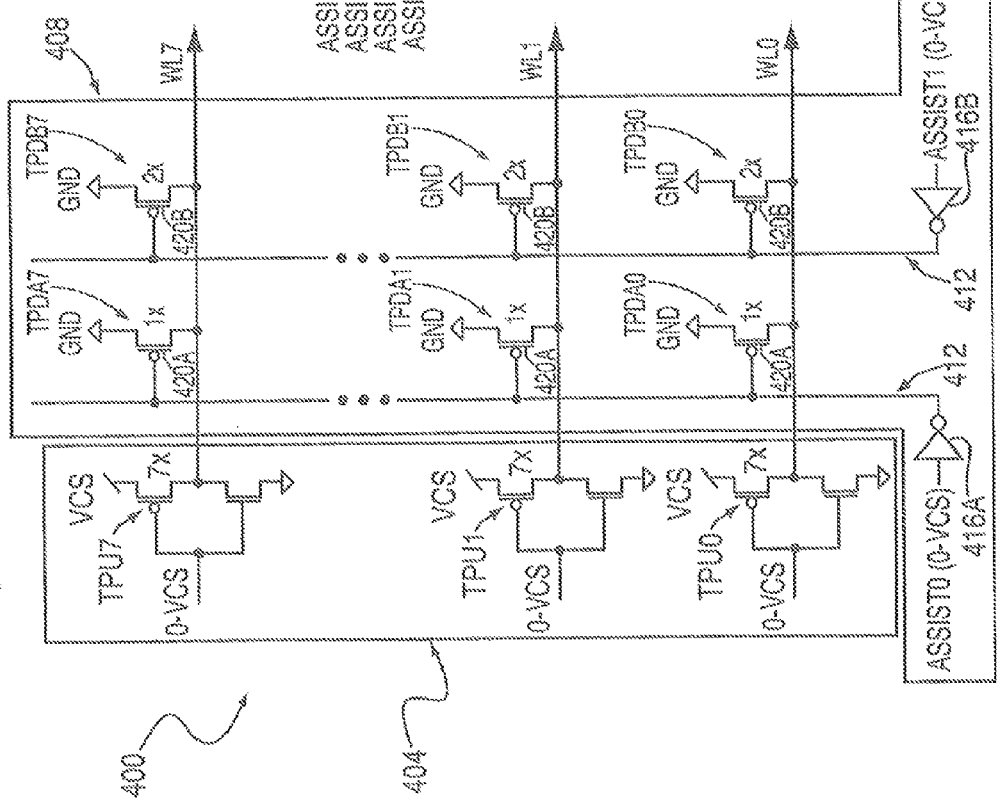

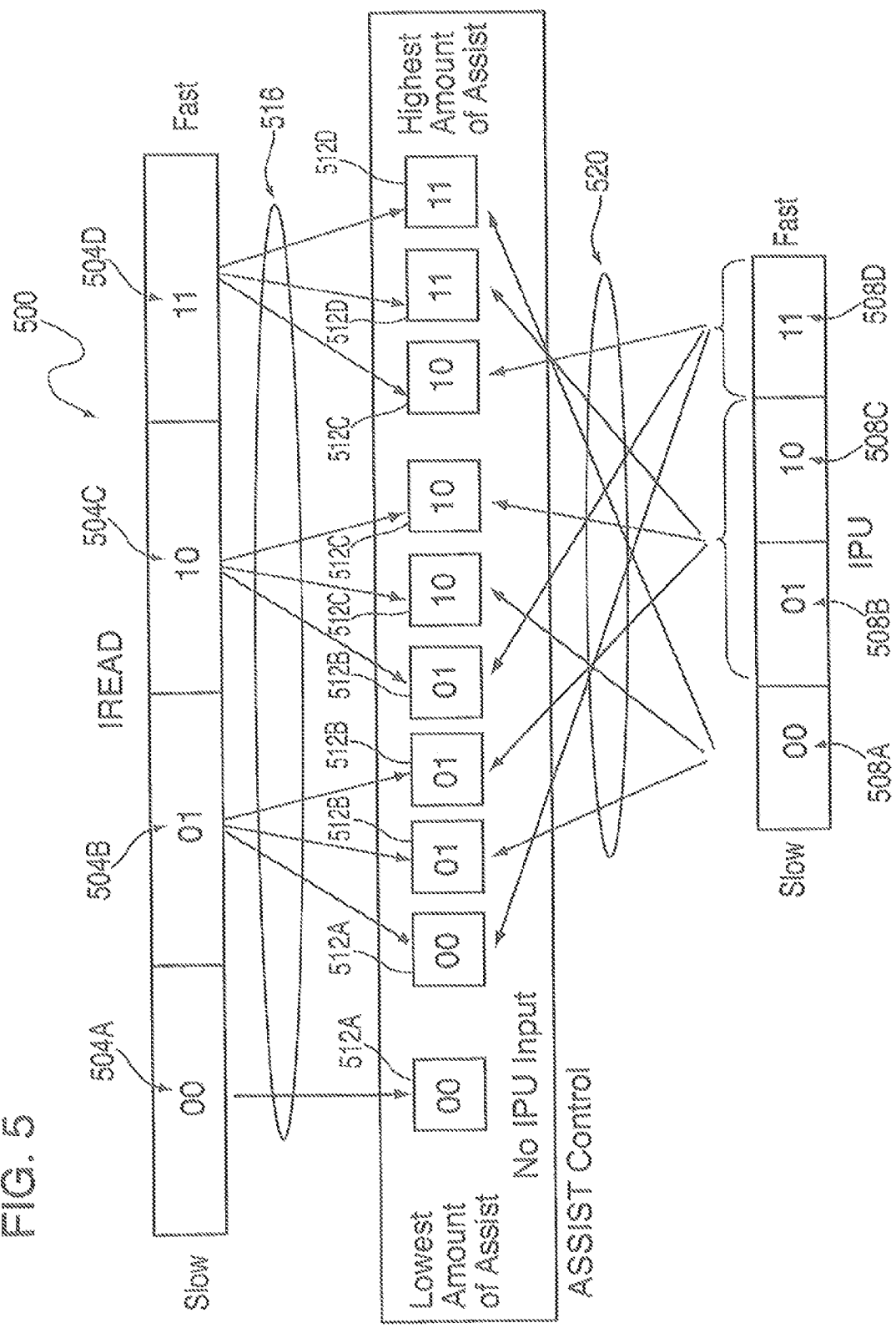

METHODS AND SYSTEMS FOR ADJUSTING WORDLINE UP-LEVEL VOLTAGE TO IMPROVE PRODUCTION YIELD RELATIVE TO SRAM-CELL STABILITY

FIELD OF THE INVENTION

The present invention generally relates to the field of semiconductor devices containing static random access memory (SRAM). In particular, the present invention is directed to methods and systems of adjusting wordline up-level voltage to improve production yield relative to SRAM-cell stability.

BACKGROUND

Static random access memory (RAM), or "SRAM," is an important type of semiconductor memory used in many integrated circuit applications, from embedded memory (e.g., as cache memory and register files) in general purpose processors and application specific integrated circuits to external memories. SRAM is a desirable type of memory due to its high-speed, low power consumption, and simple operation. Unlike dynamic RAM, SRAM does not need to be regularly refreshed to retain the stored data, and its design is generally straightforward.

A typical SRAM bitcell includes a pair of cross-coupled inverters that hold a desired data bit value (i.e., either a 1 or a 0) and the complement of that value. While SRAM is a desirable type of memory, it is known that if not properly designed and fabricated, an SRAM bitcell can become unstable when accessed, at which point the held bit value is upset, i.e., switches. Of course, such instability is intolerable. Unfortunately, the stability of an SRAM bitcell is in full conflict with the write-ability of the bitcell with respect to the strengths of the N-type devices (transistors) and P-type devices (transistors) within the bitcell. Historically, SRAM bitcells have typically been optimized to strike a balance between stability and write-ability. However, with decreasing feature sizes and decreasing operating voltages, conventional balancing techniques are meeting their limits. Because of difficulties in balancing bitcell stability and write-ability, production yields have decreased due to increases in bitcell failure rates.

SUMMARY OF THE DISCLOSURE

In one implementation, the present disclosure is directed to a method of setting wordline up-level voltage in an as-fabricated static random access memory (SRAM). The method includes: determining a first value corresponding to an approximate speed of a combination of a pass-gate device and a load device of the as-fabricated SRAM; determining a second value corresponding to an approximate speed of a drive device of the as-fabricated SRAM; selecting a wordline up-level voltage value as a function of at least one of the first and second values; and setting a wordline up-level voltage of the as-fabricated SRAM to the wordline up-level voltage value.

In another implementation, the present disclosure is directed to a system, which includes: an integrated circuit that includes: a static random access memory (SRAM) containing a plurality of bitcells that each include a pass-gate device, a load device, a drive device, and a wordline up-level assist circuitry that provides a plurality of selectable possible wordline up-level voltage values; a read current monitor designed and configured to output a read current that positively correlates to the speed of a combination of the pass-gate device and the load device of each of the plurality of bitcells; a pull-up current monitor designed and configured to output a pull-up current that positively correlates to the speed of the drive device of each of the plurality of bitcells; and circuitry designed and configured for selecting and setting a wordline up-level voltage from among the plurality of selectable possible wordline up-level voltage values.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 4A is a schematic diagram of wordline driver circuitry that can be used, for example, in conjunction with the method of FIG. 1;

FIG. 4B is a waveform diagram illustrating the four possible wordline voltage levels available using the wordline driver circuitry of FIG. 4A;

FIG. 5 is a diagram illustrating an exemplary algorithm for selecting that amount of wordline up-level assist;

DETAILED DESCRIPTION

Figure 1:
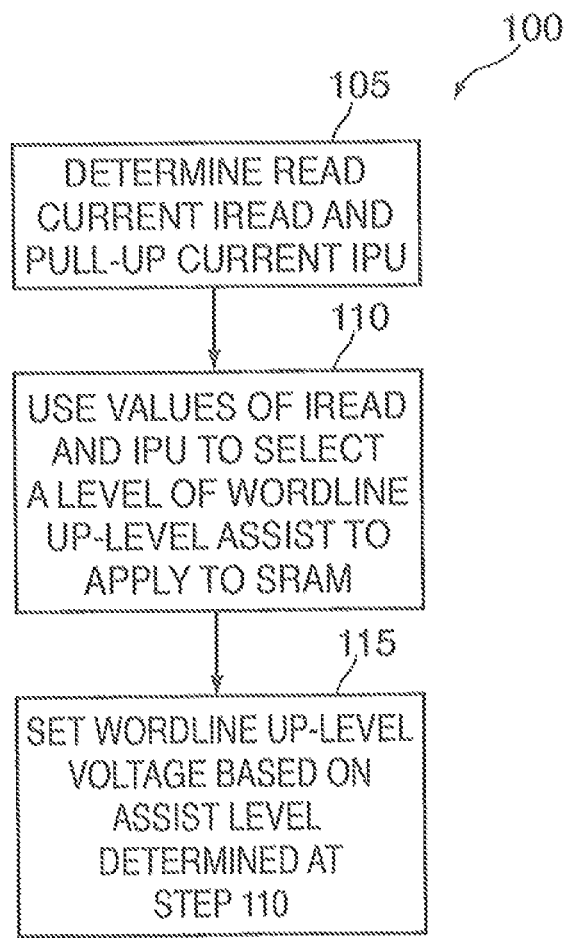
FIG. 1 is a flow diagram illustrating a method of setting a wordline up-level voltage value in an SRAM in accordance with the present invention.

Referring now to the drawings, FIG. 1 illustrates a method 100 of setting the wordline up-level voltage in a static random access memory (SRAM) as a function of certain measured voltages in the fabricated SRAM. In the context of this disclosure and the claims appended hereto, the term "SRAM" includes not only SRAM, but also structures having SRAM-based architecture, such as ternary content-address memory (TCAM) and register files, such as dual-port register files, among others. As described below in detail, method 100 can be used to increase the production yield of integrated circuits (ICs) that include SRAM, relative to SRAM bitcell stability. Briefly, greater yield can be achieved by setting the wordline up-level voltage within the SRAM to account for variation within the devices of bitcells within the SRAM. By properly setting the wordline up-level voltage level, the probability of stability failure of bitcells due to charge injection during read-disturbs can be significantly decreased, thereby increasing production yield. To implement method 100, the SRAM at issue must have appropriate circuitry that allows the wordline up-level voltage within the SRAM to be changed. Before describing method 100 in detail, relevant background regarding SRAM bitcell stability and SRAM having changeable wordline up-level voltage is first provided.

Figure 2:
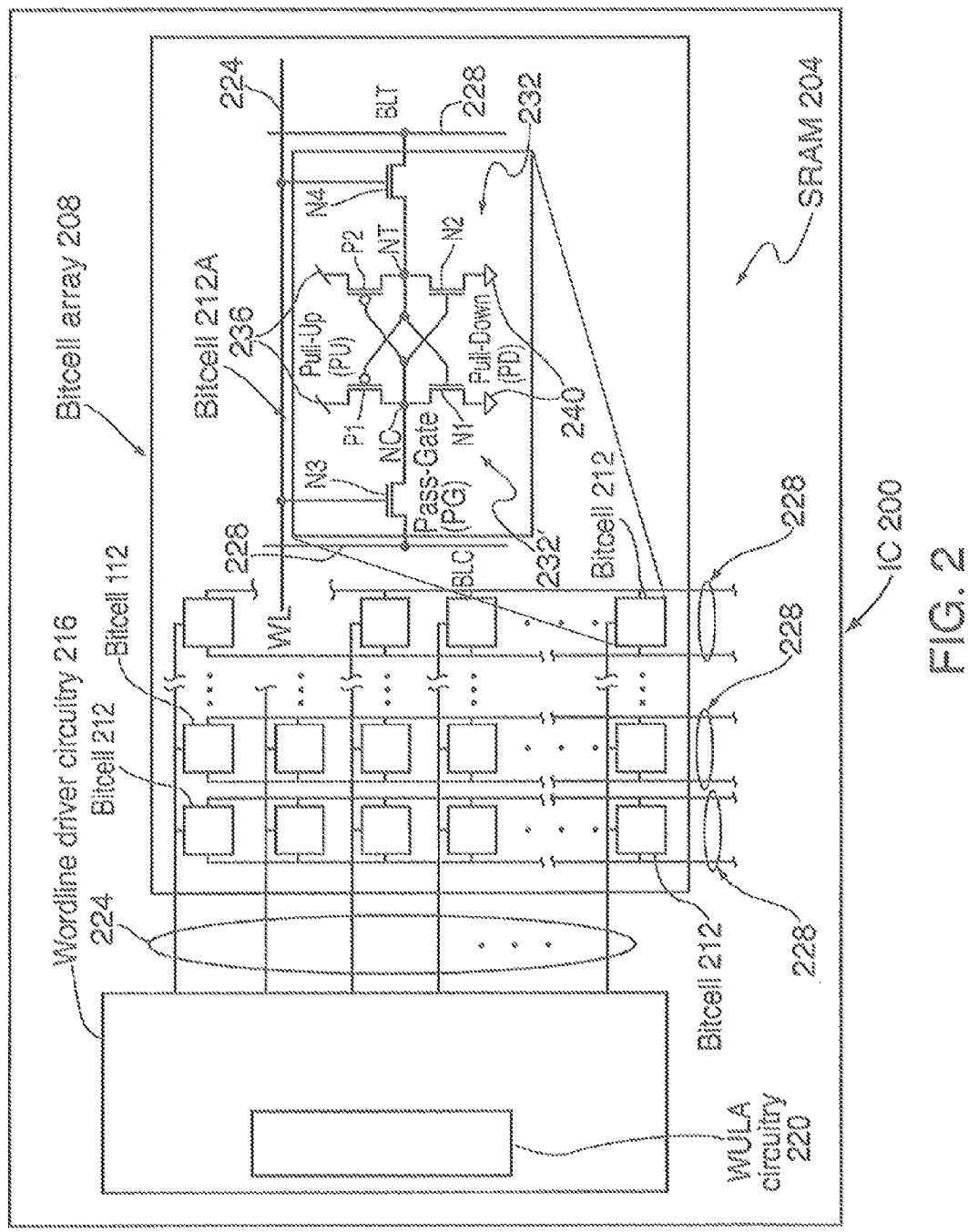
FIG. 2 is a high-level diagram of an integrated circuit that includes an SRAM that includes wordline driver circuitry having wordline up-level assist circuitry made in accordance with the present invention.

FIG. 2 shows an IC 200 that includes SRAM 204 that contains an array 208 of bitcells 212 and wordline driver circuitry 216. As those skilled in the art will readily appreciate, IC 200 can be any IC that includes one or more SRAMs, such as a microprocessor, application-specific IC, system-on-chip IC, memory chip, etc. Driver circuitry 216 includes wordline up-level assist (WULA) circuitry 220 that allows for selecting and setting a desired wordline up-level voltage from among a number of possible up-level voltage values. In one example, the desired wordline up-level voltage is selected based on certain as-tested voltage values obtained from testing SRAM 204 after fabrication. Bitcells 212 are operatively connected to corresponding wordlines 224 and complementary-pair bitlines 228 in a manner known in the art. As described below in detail, one motivation for providing multiple selectable up-level voltage values is to enhance the stability of individual bitcells 212 within SRAM 204 by reducing up-level wordline voltages, which, in turn, decreases the injection of electrical charge into the bitcells when any of the wordlines 224 within the memory is asserted. As is known, charge injection through pass-gate transistors (not shown) during a read-disturb, such as a read cycle or half-select write cycle, tends to cause bitcells 212 to become unstable. Instability can become a significant design issue with the relative small device sizes and low operating voltages of modern SRAM.

As an example of the benefit that an SRAM having WULA circuitry made in accordance with the present disclosure provides, envision a six-transistor SRAM cell, fabricated in 32-nm technology and having a VCS (SRAM Core Supply) voltage of 0.7 volts. With typical process variation in the manufacturing process used to make such an SRAM cell, the stability failure rate is about 13 stability failures for every megabit (Mb) of memory. However, with WULA circuitry that provides selectability between a normal wordline voltage level VCS (i.e., 0.7 V) and a reduced wordline voltage level (VCS −50 mV) (i.e., 0.65 V), and wherein the selection depends on where each fabricated SRAM falls within the process variation space, the proper selection of the reduced wordline voltage level for SRAMs having a fast NFET process corner can result in the reduction of the stability failure rate to about 1 failure per 10 Mb of memory. In this example, the proper use of wordline up-level reduction can improve the stability failure rate by as much as $1\sigma$, depending upon process variation, voltage, and temperature.

Those skilled in the art will readily appreciate that bitcell 212A is representative of each of bitcells 212 in array 208. As mentioned above, in this example bitcell 212A is a six-transistor, or "6T," cell and WULA circuitry 220 allows a user to select and set a desired wordline up-level voltage based on as-tested voltage values obtained from testing SRAM 204 after fabrication. In one example, the wordline voltage selected and set is selected to enhance the operation of SRAM 204 depending on whether the fabricated SRAM is write-limited, stability-limited, or somewhere in between write-limited and stability-limited.

In the example shown, bitcell 212A includes a pair of cross-coupled inverters 232, 232' each formed by one of a pair p-type load (or pull-up) transistors P1, P2 electrically connected to a voltage source line 236 and a corresponding one of a pair of n-type drive (or pull-down) transistors N1, N2 electrically connected to a voltage sink line 240, e.g., ground. Together, cross-coupled inverters 232, 232' form a flip-flop circuit that is capable of storing a single data bit. Bitcell 212A has two stable states used to denote a "1" bit and a "0" bit, respectively, on internal "storage" nodes NC, NT. Two additional n-type transistors N3, N4, called "access" or "pass-gate" transistors, electrically connect cross-coupled inverters 232, 232' to corresponding respective ones of bit lines BLC, BLT and are controlled by a corresponding wordline, here wordline WL.

To function properly, each storage node NC, NT holds a voltage level, either high (logic "1") or low (logic "0"). When reading data from bitcell 212A, the current generated as pass-gate transistors N3, N4 turn on must not flip the voltage level at the storage nodes NC, NT from one logic level to the other. To stabilize bitcell 212A, driver, or pull-down, transistors N1, N2 are typically fabricated to have a higher conductance than pass-gate transistors N3, N4 so that the storage node NC, NT that stores a logic "0" will be held low by the strong pull-down transistor. It is known that a 6T SRAM bitcell, such as bitcell 212A, suffers a stability problem associated with a read operation or a "half-select" write operating mode. In the half-select mode, a row, i.e., one of wordlines 224, is selected while one or more columns, i.e., one or more complementary-pair bitlines 228, are not selected for writing. In this case, the non-selected complementary-pair bitline(s) 228 is/are subjected to the read disturb condition.

Accessing bitcell 212A for a read or a write operation entails driving wordline 224 in a manner that turns on pass-gate transistors N3, N4 for all of the SRAM cells on that wordline. With pass-gate transistors N3, N4 turned-on, cross-coupled inverters 232, 232' are electrically coupled to the corresponding bitline pairs BLC, BLT, partially selecting (or "half selecting") all of the bitcells, such as bitcell 212A, on wordline 224. Selecting one of the columns (here, one of complementary-pair bitlines 228) selects the corresponding bitcell 212 on that wordline 224 containing the bits actually being accessed. The remaining (M−1)-by-K bitcells 212 remain half-selected during the access.

During a read cycle, each bitcell 212 on the selected wordline 224 couples its contents to its corresponding complementary-pair bitlines 228 such that each of the bitlines may droop, usually, only to develop a small-differential signal (e.g., 50 mV). At some point after sensing data for the selected bits, the selected wordline 224 returns low, deselecting/isolating bitcells 212 on that wordline. As long as the selected wordline 224 remains high, however, pass gate transistors N3, N4 (see bitcell 212A) in each accessed bitcell 212 couple the reference voltage onto both internal storage nodes NC, NT. Depending upon the length of time that the selected wordline 224 remains high, the pass-gate transistors N3, N4 coupling the partially selected cells to complementary-pair bitlines 228 tend to pull cross-coupled inverters 232, 232' (i.e., the storage nodes NC, NT) toward a common voltage. This is normally a measure of the stability of an SRAM cell. That is, measuring the stability of an SRAM cell involves selecting the SRAM cell, clamping the corresponding bitline pairs to a voltage, and noting the point at which the cell becomes unstable or switches, i.e., is upset. Imbalances in cell devices can upset half-selected cells or at the very least to become unstable at normal design voltages. This instability is intolerable.

Referring again to FIG. 1, in this example, method 100 can begin at step 105 by determining two characteristics of the as-fabricated SRAM at issue, namely a read current IREAD and a pull-up current IPU. Generally, read current IREAD provides a measure of the strength of the pass-gate devices and their corresponding pull-down devices in the SRAM cells (see, e.g., pass-gate transistors N3, N4 and drive transistors N1, N2 in FIG. 2), and pull-up current IPU provides a measure of the strength of the pull-up devices in the SRAM cells (see, e.g., load transistors P1, P2 of FIG. 2). These characteristics, i.e., read current IREAD and pull-up current IPU are used as described below to determine how much up-level assist should be provided to the SRAM at issue to account, for example, for variation in the SRAM cells due to physical variations in the devices of the SRAM cells caused by process variation.

Figure 3:
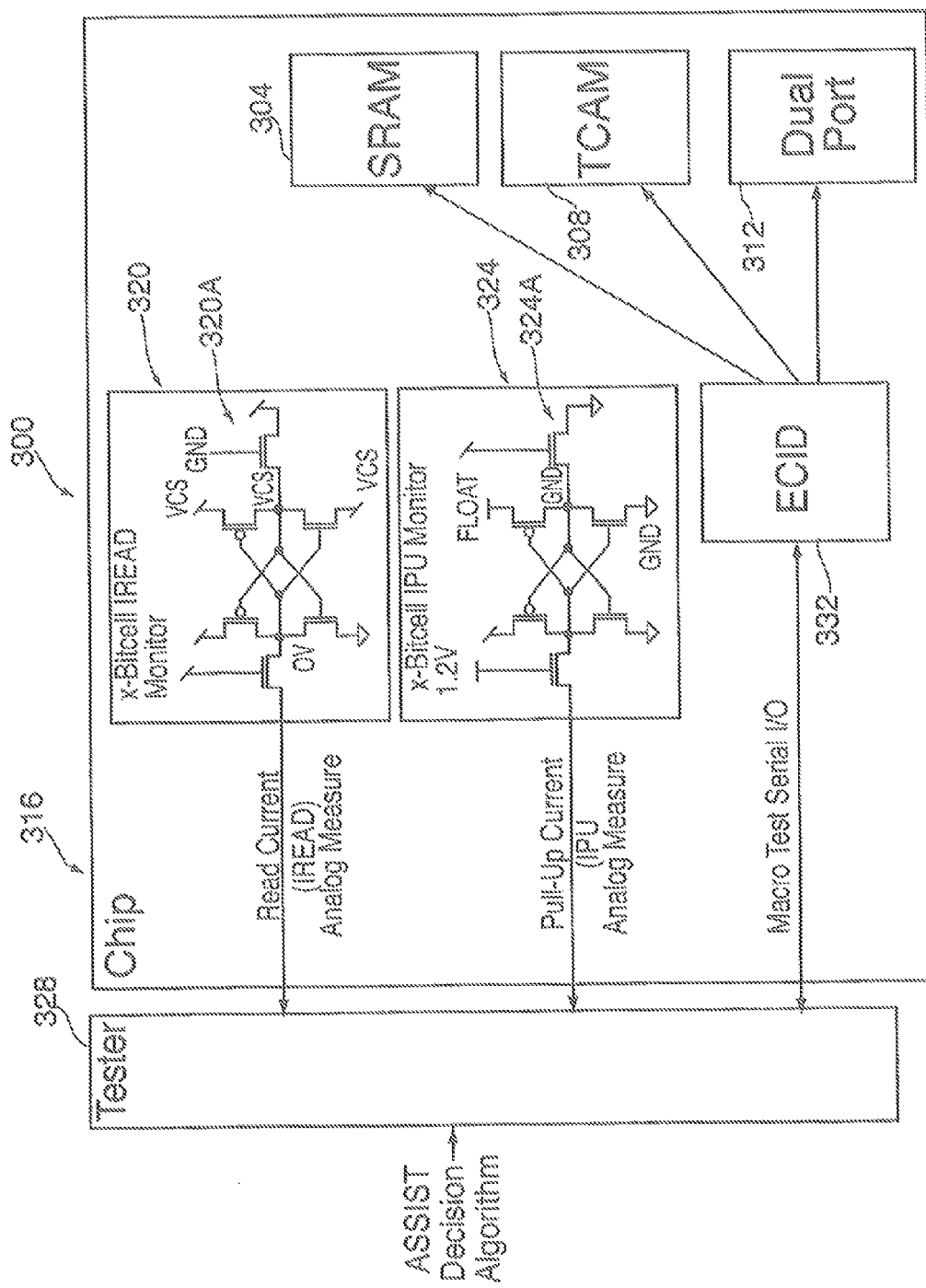
FIG. 3 is a block diagram illustrating a system for measuring SRAM characteristics and implementing wordline up-level assist.

FIG. 3 illustrates an exemplary system 300 that can be used to obtain read current IREAD and pull-up current IPU. In this embodiment, the SRAM at issue, here SRAM 304, TCAM 308, and dual port memory 312, resides on die, or chip 316, that is fabricated to contain two bitcell monitor arrays 320, 324 of bitcells 320A, 324A (only one shown for convenience) that are specially configured for measuring read current IREAD and pull-up current IPU. As those skilled in the art will readily appreciate, the devices, here transistors, within bitcells 320A, 324A are made under the same process conditions as the like devices of the functioning SRAM aboard chip 316 and, therefore, largely embody the same physical variations caused by process variation. Therefore, the read current IREAD and up-level current IPU measurements from bitcell monitor arrays 320, 324, respectively, provide suitable information for use in method 100 of FIG. 1. In this embodiment, each bitcell monitor array 320, 324 contains 128 like bitcells 320A, 324A, respectively, to smooth variation, and the bitcells within each array are read in parallel. As those skilled in the art will readily appreciate, bitcells 320A, 324A in each bitcell monitor array 320, 324 are electrically connected in a manner that allows for the reading of the appropriate signals. Examples of such electrical connections are shown in FIG. 3.

System 300 includes a tester 328 configured to make the analog current measurements of read current IREAD and pull-up current IPU. Of course, chip 316 is provided with suitable test pads (not shown) for effecting the appropriate electrical connections between the chip and tester 328. Those skilled in the art will understand how tester 328 can be implemented such that a detailed explanation of the tester is not needed to allow skilled artisans to implement the various features of the present invention.

At step 110 of FIG. 1, the measured values of read current IREAD and pull-up current IPU are used to select a level of wordline up-level assist to apply to the SRAM aboard chip 316. In one example, wherein the SRAM aboard chip 316 includes wordline up-level assist (WULA) circuitry that provides four possible up-level assist voltage values, the read current IREAD and pull-up current IPU are used to select from among the four possible values. An example of such WULA circuitry is provided in FIG. 4A.

FIG. 4A illustrates wordline driver circuitry 400 that can be used to implement a WULA scheme in an SRAM, such as SRAM 204 of FIG. 2. In this example, wordline driver circuitry 400 is configured to provide four possible wordline voltage levels that can be selected for the actual wordline voltage level to use in the fabricated SRAM. Of course, only a portion of wordline driver circuitry 400 is shown for clarity and convenience.

Wordline driver circuitry 400 includes drive-voltage circuitry 404 for providing a drive voltage, such as VCS, to a plurality of wordlines, here, wordlines WL0 to WL7. In this example, each wordline WL0-WL7 is driven by a corresponding pull-up device, here, transistors TPU0 to TPU7. Wordline driver circuitry 400 also includes WULA circuitry 408 that includes a pair of pull-down devices, here, transistors TPDA0, TPDB0 to TPDA7, TPDB7, for each wordline WL0 to WL7. Although not shown, the bitcells associated with each wordline WL0 to WL7 are to the right of the corresponding transistor pairs TPDA0, TPDB0 to TPDA7, TPDB7 relative to FIG. 4A. WULA circuitry 408 also includes selection circuitry 412 that permits the selection of which pull-down transistors, i.e., either transistors TPDA0 to TPDA7 or transistors TPDB0 to TPDB7, or both sets, to activate so as to select the desired wordline up-level voltage value. In this example, selection circuitry 412 includes two buffers 416A, 416B for driving the corresponding respective gate electrodes 420A, 420B upon selection of the corresponding buffer.

As mentioned above, wordline driver circuitry 400 is configured to provide four possible wordline up-level voltage values. This is achieved in this example by making each pull-down transistor TPDA0 to TPDA7 one strength (here, 1×) and making each pull-down transistor TPDB0 to TBDB7 another strength (here, 2×). By making each pull-down transistor TPDB0 to TPDB7 twice as strong as each pull-down transistor TPDA0 to TPDA7, those skilled in the art can appreciate that three equal voltage steps can be achieved as follows. Referring to FIG. 4B, as well as to FIG. 4A, when neither of buffers 416A, 416B are selected i.e., ASSIST<0:1>=00, neither transistors TPDA0 to TPDA7 nor transistors TPDB0 to TPDB7 are selected. Therefore, none of these transistors TPDA0 to TPDA7, TPDB0 to TPDB7 are active, and no pull-down is occurring on wordlines WL0 to WL7. Therefore, the wordline voltage 424 (FIG. 4B) is at the full VCS level.

However, when buffer 416A is selected and buffer 416B is not selected, i.e., when ASSIST<0:1>=10, pull-down transistors TPDA0 to TPDA7 are activated, thereby pulling wordline voltage 424 (FIG. 4B) on each wordline WL0 to WL7 down by 1×, according to the strength of these transistors. Similarly, when buffer 416B is selected and buffer 416A is not selected, i.e., when ASSIST<0:1>=01, pull-down transistors TPDB0 to TPDB7 are activated, thereby pulling wordline voltage 424 (FIG. 4B) on each wordline WL0 to WL7 down by 2×, depending on the strength of these transistors. Then, when both buffers 416A, 416B are selected, i.e., when ASSIST<0:1>=11, all of pull-down transistors TPDA0 to TPDA7, TPDB0 to TPDB7 are activated, thereby pulling wordline voltage 424 (FIG. 4B) on each wordline WL0 to WL7 down by a total of 3×, i.e., the sum of each the 1× of transistors TPDA0 to TPDA7 and the 2× of the corresponding one of transistors TPDB0 to TPDB7.

When a WULA scheme includes four levels of assist, such as provided by WULA circuitry 408 of FIG. 4A, and those four levels are achieved using essentially two selection bits wherein <00>=no assist, <10>=medium low assist, <01>=medium high assist, and <11>=maximum assist, the following exemplary selection algorithm can be used. A goal of this algorithm is to maximize the wordline up-level voltage for devices needing the most assist without compromising write margin and performance. In this algorithm, if the process corner is a fast-NFET, slow-PFET (FS) process corner (a worst case for bitcell stability), the maximum wordline up-level assist will be applied using the <11> value of the selection bits. In this case, up-level current IPU needs to be considered in the algorithm. If the process corner is a fast-NFET, fast PFET (FF) process corner, the amount of wordline up-level assist can be relaxed from the maximum setting to inhibit a stability-limited SRAM from becoming write-limited. Consequently, either the medium high assist level of assist or the medium low level of assist can be applied using either the <01> value or the <10> value of the selection bits, respectively, and up-level current IPU needs to be considered. For both a slow-NFET, slow-PFET (SS) process corner and a slow-NFET, fast-PFET (SF) process corner, the minimum amount of wordline up-level assist is used. In this example, no up-level assist is provided by using the <00> value of the selection bits. It is noted that the SF process corner is the worst case for both write-ability and readability. For both of the SS and SF process corners, pull-up current IPU can be ignored.

FIG. 5 is a diagram 500 that graphically illustrates the foregoing algorithm in a case where each of read current IREAD and pull-up current IPU are digitized with a two-bit value based on their strength, or speed. In particular, each of read current IREAD and pull-up current IPU are assigned one of four possible values, i.e., <00>, <01>, <10>, and <11>, depending on the speed of the corresponding device. These digitized values 504A-D, 508A-D, respectively, of read current IREAD and pull-up current IPU are then used to select the amount of wordline up-level assist, which in this example is also assigned a two-bit value 512A-D based on level of assist, ranging from <00>=no assist to <11>=maximum amount of assist.

Using arrows 516, 520, diagram 500 can be used to determine a desired level of wordline up-level assist based on a given set of read current IREAD and pull-up current IPU. For example, if read current IREAD indicates that the corresponding pass-gate device is fast, i.e., IREAD has a value of <11> then the amount of assist will be either the highest amount 512D) or the next to highest amount 512C), depending on the value of pull-up current IPU. If pull-up current is assigned to any one of values 508A-C (i.e., <00>, <01>, <10>), the amount of assist will be the highest value 512D). However, if pull-up current IPU indicates that the corresponding load device is fast, then the amount of assist can be relaxed a bit to the second-highest value 512C). The amount of wordline up-level assist for other pairs of read current IREAD and pull-up current IPU can be determined in a similar fashion. As those skilled in the art will readily appreciate, the algorithm shown graphically in FIG. 5 can be implemented in another fashion, such as in a lookup table.

Figure 6:
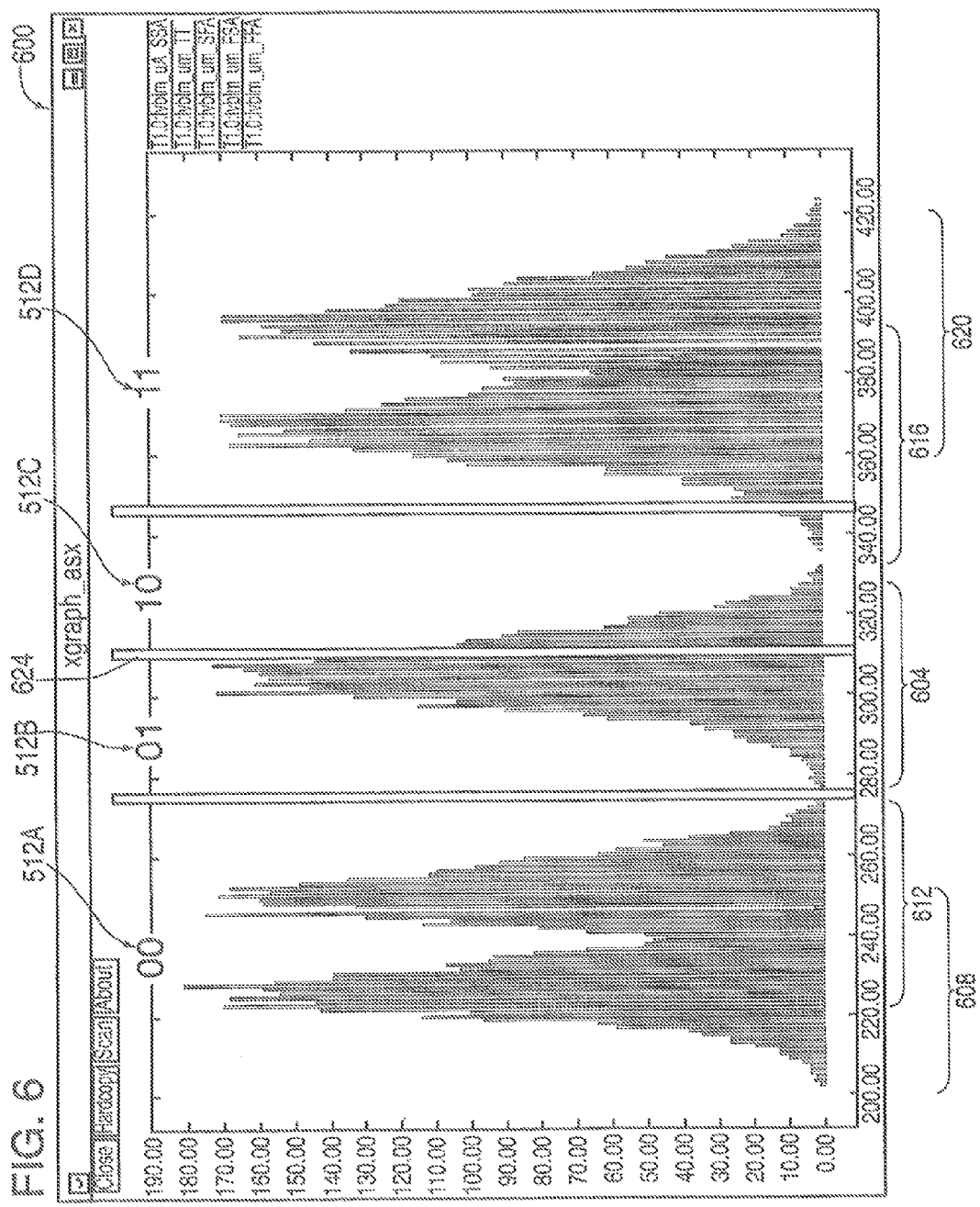
FIG. 6 is a graph of exemplary distributions for the measured parameter IREAD.

FIG. 6 is a graph 600 illustrating distributions 604, 608, 612, 616, 620 of the read current IREAD for various process corners and the assignment of digitized values 512A-D (also in FIG. 5) to those distributions as used in diagram 500 of FIG. 5. Distributions 604, 608, 612, 616, 620 are based on simulations based on actual process variation statistics. The center distribution 604 is known as the "TT" distribution and represents the statistical values of read current IREAD for process parameters that result in the mean, or "typical," speeds for both NFETs and PFETs. As can be appreciated, the geometric center of TT distribution 604 falls along the dividing line 624 between the medium-slow and medium-fast digitized levels 512B-C (i.e., <01> and <10>). In other words, NFET and PFET devices producing read currents falling along dividing line 624 are neither fast nor slow relative to the typical speeds of those devices.

Distributions 608, 612 represent statistical values of read current IREAD for, respectively, SS and SF process corners. These distributions 608, 612 are assigned to the lowest speed digitization level 512A) of read current IREAD. Similarly, distributions 616, 620 represent statistical values of read current IREAD for, respectively, FS and FF process corners, and these distributions are assigned to the highest speed digitization level 512D) of read current IREAD. Those skilled in the art will readily appreciate that a process-corner distribution graph similar to graph 600 of FIG. 6 can be made for pull-up current IPU and, likewise, that the various distributions can be digitized to four speed values in a manner similar to that described relative to FIG. 6.

Once the level of assist to apply to the wordline up-level of the SRAM has been determined at step 110 of FIG. 1, method 100 can proceed to step 115 at which the determined level is set within SRAM so that the SRAM functions with that level of assist throughout its service life. As those skilled in the art will readily appreciate, the setting of the determined level of up-level assist can be achieved in any of a number of ways and can depend on the type of WULA circuitry implemented. For example, in the context of WULA circuitry 408 of FIG. 4A, the determined level of wordline up-level assist can be applied by asserting the appropriate values on inputs ASSIST0, ASSIST1. These levels can be set, for example, using eFUSE circuitry (not shown) or other ways of permanently setting input values.

Figure 7:
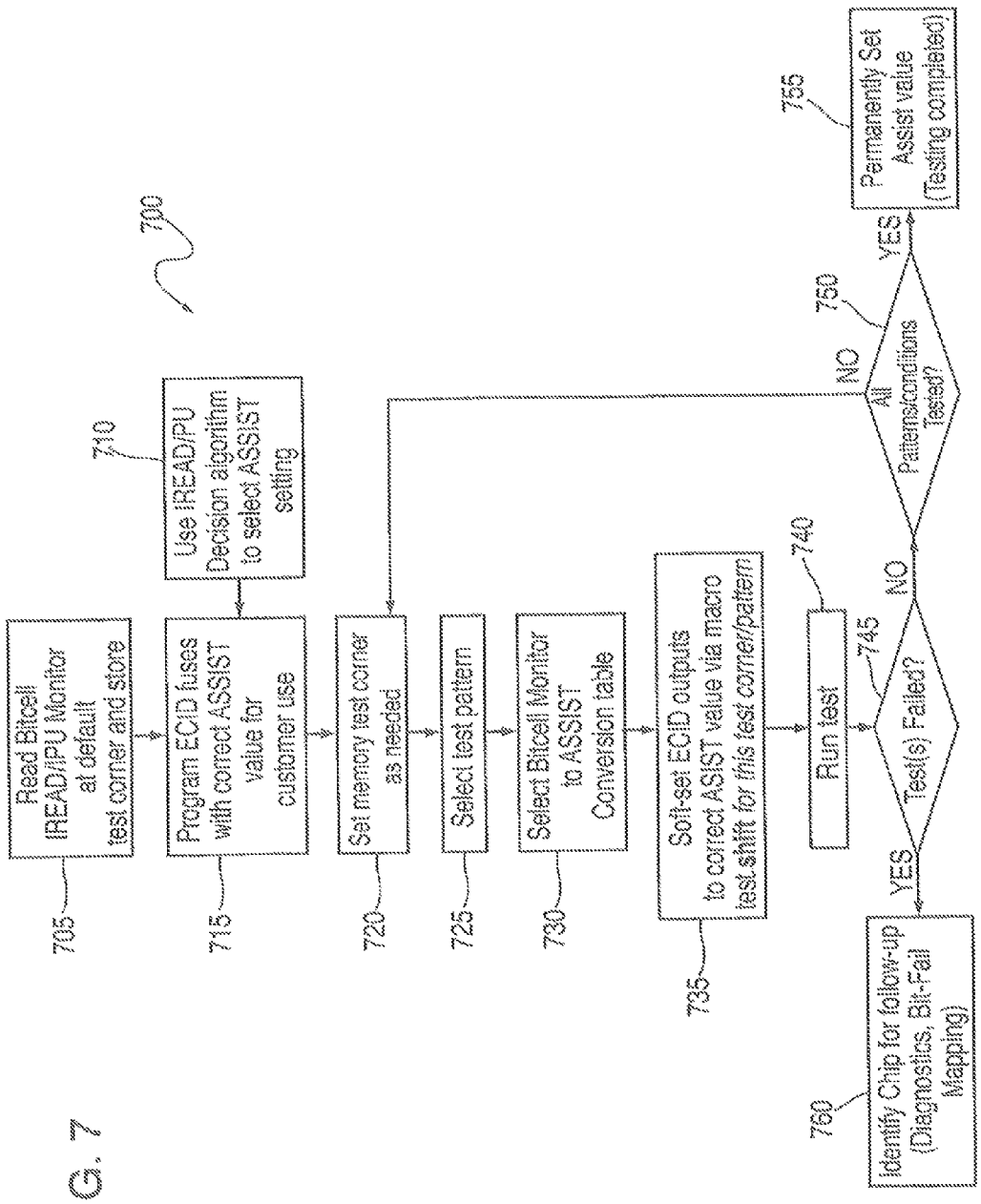
FIG. 7 is a flow diagram illustrating a method of setting wordline up-level voltage values in various types of SRAM using an electronic chip identification process.

FIG. 7 illustrates a method 700 of setting wordline up-level voltage values that are based on a WULA scheme. Referring to FIG. 3, in this example, each of SRAM 304, TCAM 308, and dual-port register files 312, has independently settable wordline up-level voltage levels that can be set with any one of four voltage values, depending on the as-measured values of read current IREAD and pull-up current IPU. In this example, these voltage levels can be set using an eFUSE-based electronic chip identification (ECID) macro 332 having an array (not shown) of independently blowable eFUSES that can be electrically connected to appropriate voltage sources and sinks to provide the proper input to the WULA circuitry. For example, each of SRAM 304, TCAM 308, and dual-port register files 312 may have corresponding WULA circuitry (not shown) that is similar to WULA circuitry 408 of FIG. 4A that requires input signals on lines ASSIST0, ASSIST1, the eFUSES within ECID macro 332 can be appropriately connected to those lines of each of the SRAM, TCAM, and register files so that when ones of the eFUSES are properly blown, the signals on lines ASSIST0, ASSIST1 are the signals corresponding to the desired wordline up-level assist values, such as the values 512A-D appearing in FIGS. 5 and 6.

Referring to FIG. 7, and also to FIG. 3, at step 705 read current IREAD and pull-up current IPU are measured using tester 328 at a default test corner, here, 0.9V/25° C., and the measurements are stored. At step 710, the measured values of read current IREAD and pull-up current IPU are used to determine the level of WULA to apply to each of SRAM 304, TCAM 308, and register files 312. If the WULA circuitry is like WULA circuitry 408 of FIG. 4A, step 710 can involve using the algorithm described above in connection with steps 110 of method 100 of FIG. 1 for each of SRAM 304, TCAM 308, and register files 312.

At step 715, the eFUSES within ECID macro 332 are temporarily set with the correct values of ASSIST0 and ASSIST1 (see FIG. 4A) for each of SRAM 304, TCAM 308, and register files 312 so that the SRAM, TCAM, and register files operate using the corresponding wordline up-level voltage values just set so that the memories can be tested. Once the up-level voltage values, including any assist needed, have been set, at step 720 tester 332 is set to an appropriate test corner as needed, and at step 725 an appropriate memory test pattern is selected. At step 730, the appropriate bitcell-monitor-array-to-ASSIST-level-conversion table is selected. Differing tables may allow the measured solution to be modified in order to improve yield. The appropriate table is a function of the particular test corner and test pattern used for a particular test, and the appropriate ASSIST-level value is a function of the table and bitcell monitor array value.

Once the appropriate table has been selected at step 730, at step 735 the outputs of ECID macro 332 are soft-set (i.e., the eFUSES are not yet blown) to the correct values for SRAM 304, TCAM 308, and register files 312 for the particular combination of test corner/test pattern being run on this iteration. At step 740, tester 332 performs a functional test on SRAM 304, TCAM 308, and register files 312 using the soft-set ASSIST values and the selected test pattern. Steps 720 to 740 can be repeated for differing test corners and test patterns as is appropriate under the conditions at hand.

After steps 720 to 740 have been repeated for the appropriate test conditions, method 700 proceeds to step 745, wherein it is determined whether or not any of the test failed.

If there were no failures, method 700 proceeds to step 750 wherein it is determined whether or not all patterns/conditions have been tested. If not, method 700 loops back to step 720 for continuing testing using different patterns and/or test corner conditions. If at step 750 it is determined that all patterns/conditions have been tested, at step 755 the appropriate ASSIST-level values are permanently set by blowing appropriate ones of the eFUSES within ECID macro 332. If back at step 745 it is determined that one or more failures have occurred during the test iterations, at step 760 chip 316 is identified for follow-up, for example, diagnostics and/or bit-fail mapping, among other things.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of setting wordline up-level voltage in an as-fabricated static random access memory (SRAM), comprising:
    determining a first value corresponding to an approximate speed of a combination of a pass-gate device and a load device of the as-fabricated SRAM;
    determining a second value corresponding to an approximate speed of a drive device of the as-fabricated SRAM;
    selecting a wordline up-level voltage value as a function of at least one of the first and second values; and
    setting a wordline up-level voltage of the as-fabricated SRAM to the wordline up-level voltage value.

2. A method according to claim 1, wherein said determining the first value includes measuring a first current from a bitcell monitor array.

3. A method according to claim 2, wherein the SRAM has a bitcell architecture and said measuring the first current includes measuring the first current in parallel from a plurality of cells having the bitcell architecture.

4. A method according to claim 1, wherein said determining the second value includes measuring a second current from a bitcell monitor array.

5. A method according to claim 4, wherein the SRAM has a bitcell architecture and said measuring the second current includes measuring the second current in parallel from a plurality of cells having the bitcell architecture.

6. A method according to claim 1, wherein said selecting the wordline up-level voltage value includes assigning the first value a first spectral value along a spectrum of slow to fast.

7. A method according to claim 6, wherein said selecting the wordline up-level voltage value includes assigning the second value to a second spectral value along a spectrum of slow to fast.

8. A method according to claim 7, wherein said selecting the wordline up-level voltage value includes selecting the wordline up-level voltage value from a plurality of possible voltage values lying along a spectrum having a minimum up-level assist end and a maximum up-level assist end.

9. A method according to claim 8, wherein said selecting the wordline up-level voltage value includes selecting one of the plurality of possible voltage values from the maximum up-level assist end of the spectrum for the wordline up-level voltage value when the first spectral value corresponds to fast devices.

10. A method according to claim 8, wherein said selecting the wordline up-level voltage value includes selecting one of the plurality of possible voltage values from the minimum up-level assist end of the spectrum for the wordline up-level voltage value when the first spectral value corresponds to slow devices.

11. A method according to claim 1, wherein said setting the wordline up-level voltage includes permanently setting the wordline up-level voltage.

12. A method according to claim 11, wherein said permanently setting the wordline up-level voltage includes blowing at least one eFUSE.

13. A method according to claim 1, wherein said setting includes temporarily setting the wordline up-level voltage value and the method further comprises, following said temporarily setting, testing the as fabricated SRAM and changing the wordline up-level voltage value in response to said testing.

14. A method according to claim 1, wherein said setting the wordline up-level voltage includes selectively activating one or more pull-down devices electrically coupled to at least one wordline in the SRAM.

15. A system, comprising:
    an integrated circuit that includes:
        a static random access memory (SRAM) containing a plurality of bitcells that each include a pass-gate device, a load device, a drive device, and a wordline up-level assist circuitry that provides a plurality of selectable possible wordline up-level voltage values;
        a read current monitor designed and configured to output a read current that positively correlates to the speed of a combination of said pass-gate device and said load device of each of said plurality of bitcells;
        a pull-up current monitor designed and configured to output a pull-up current that positively correlates to the speed of said drive device of each of said plurality bitcells; and
        circuitry designed and configured for selecting and setting a wordline up-level voltage from among the plurality of selectable possible wordline up-level voltage values.

16. A system according to claim 15, wherein said read current monitor includes an array of cells that contain the same devices as each of said plurality of bitcells but are electrically connected so as to provide said read current.

17. A system according to claim 15, wherein said SRAM includes a plurality of wordlines and said wordline up-level assist circuitry includes at least one pull-down device electrically coupled to at least one of said plurality of wordlines.

18. A system according to claim 15, wherein said circuitry designed and configured for selecting and setting the wordline up-level voltage includes a plurality of eFUSES for permanently setting the wordline up-level voltage.

19. A system according to claim 15, further comprising a tester designed and configured for measuring the read current and the pull-up current, said tester containing an algorithm for determining which of said selectable possible wordline up-level voltage values to select as a function of the read current and the pull-up current as measured by said tester.

* * * * *